(12) United States Patent
Zhang

(10) Patent No.: US 8,315,829 B2
(45) Date of Patent: *Nov. 20, 2012

(54) BATTERY STATE-OF-HEALTH MONITORING SYSTEM AND METHOD

(75) Inventor: Xiaodong Zhang, Mason, OH (US)

(73) Assignee: GM Global Technology Operations LLC, Detroit, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 13/150,429

(22) Filed: Jun. 1, 2011

(65) Prior Publication Data

US 2011/0231054 A1    Sep. 22, 2011

Related U.S. Application Data

(62) Division of application No. 12/107,323, filed on Apr. 22, 2008, now Pat. No. 7,983,862.

(51) Int. Cl.
*G01R 31/36* (2006.01)
(52) U.S. Cl. .......................................................... 702/63
(58) Field of Classification Search .................... 702/63
See application file for complete search history.

(56) References Cited

U.S. PATENT DOCUMENTS

| | | | |
|---|---|---|---|
| 4,731,601 A | 3/1988 | Nowakowski et al. | |
| 6,472,875 B1 | 10/2002 | Meyer | |
| 2008/0295726 A1 | 12/2008 | Cooper et al. | |
| 2009/0051364 A1 | 2/2009 | Ishida et al. | |
| 2009/0146664 A1* | 6/2009 | Zhang | 324/433 |
| 2009/0265125 A1 | 10/2009 | Zhang | |

OTHER PUBLICATIONS

Ryan J. Grube, Dec. 17, 2008, Automotive Battery State-Of-Health Monitoring Methods, p. 1-106.*
Eberhard Meissner, Battery Monitoring and Electrical Energy Management Precondition for future vehicle electric power systems, 2003 Elsevier Science B.V., p. 79-98).*
Meissner et al.,"Vehicle electric power systems are under change! Implications for design, monitoring and management of automotive batteries", Journal of Power Sources 95 (2001) 13-23.
Blanke et al.,"Impedance measurements on lead-acid batteries for state-of-charge, state-of-health and cranking capability prognosis in electric and hybrid electric vehicles", Journal of Power Sources 144 (2005) 418-425.

* cited by examiner

*Primary Examiner* — Tung S Lau

(57) ABSTRACT

A battery state-of-health monitoring and prognosis method includes training off-line parity-relation parameters between extracted battery voltage and current signals during off-line battery discharge events using at least one good off-line battery. Portions of terminal voltage and current signals of an on-board battery corresponding to an on-board engine cranking process are extracted, and battery voltage of the on-board battery are estimated based on the parity-relation parameters and the extracted portions of the on-board battery current signals. A diagnostic residual defining a deviation between the battery voltage estimation of the on-board battery and extracted portions of the on-board battery terminal voltage signals is generated. A measure of battery state-of-health based on the diagnostic residual is then provided.

3 Claims, 5 Drawing Sheets

BATTERY STATE-OF-HEALTH MONITORING SYSTEM AND METHOD

CROSS REFERENCE TO RELATED APPLICATIONS

This application is a divisional of application Ser. No. 12/107,323, filed Apr. 22, 2008, which is incorporated herein by reference.

TECHNICAL FIELD

This invention is related to vehicle battery monitoring systems.

BACKGROUND

The number of electrical devices in modern vehicles has been rapidly increasing. The vehicle electric power system is required to supply sufficient power to all such devices, including safety related systems and convenience and entertainment systems. An electric power management system balances the power demanded and the power provided to ensure the vehicle's start-up ability. An accurate and reliable knowledge of the battery state is therefore desirable for effective electric power management.

SUMMARY

A battery state-of-health monitoring and prognosis method includes training off-line parity-relation parameters between extracted battery voltage and current signals during off-line battery discharge events using at least one good off-line battery. Portions of terminal voltage and current signals of an on-board battery corresponding to an on-board engine cranking process are extracted, and battery voltage of the on-board battery are estimated based on the parity-relation parameters and the extracted portions of the on-board battery current signals. A diagnostic residual defining a deviation between the battery voltage estimation of the on-board battery and extracted portions of the on-board battery terminal voltage signals is generated. A measure of battery state-of-health based on the diagnostic residual is then provided.

BRIEF DESCRIPTION OF THE DRAWINGS

One or more embodiments will now be described, by way of example, with reference to the accompanying drawings, in which.

DETAILED DESCRIPTION

The battery state-of-health (SOH) monitoring system and method in accordance with the present disclosure uses a parity-relation based diagnostic residual that combines SOH information corresponding to battery resistance and voltage loss during cranking to enhance battery diagnostic and prognostic performance.

The battery SOH monitoring system and method disclosed herein does not require a physical battery model or real-time identification of SOH-related battery model parameters and thus provides computational efficiency over known model-based battery SOH monitoring systems.

The battery SOH monitoring system and method uses parity-relation based battery diagnosis and prognosis to provide pre-warning of battery end-of-life, to help avoid unnecessary replacement of batteries, to reduce incidents of no-trouble-found and associated warranty costs, and to enhance electric power management in a vehicle environment.

The disclosure provides a parity-relation based data-driven approach to battery SOH monitoring and prognosis. A diagnostic residual is designed to implicitly combine a plurality of battery SOH information determined during engine cranking, including parameters such as battery voltage loss and internal resistance. Combined SOH information is used to improve the accuracy and robustness of the battery diagnosis and prognosis. The SOH information includes binary battery state-of-health (SOH) diagnosis (good or bad) and % level based prognosis during cranking. Cranking data collected using known good batteries are used to train a linear parity-relation between battery voltage and current.

Figure 1:
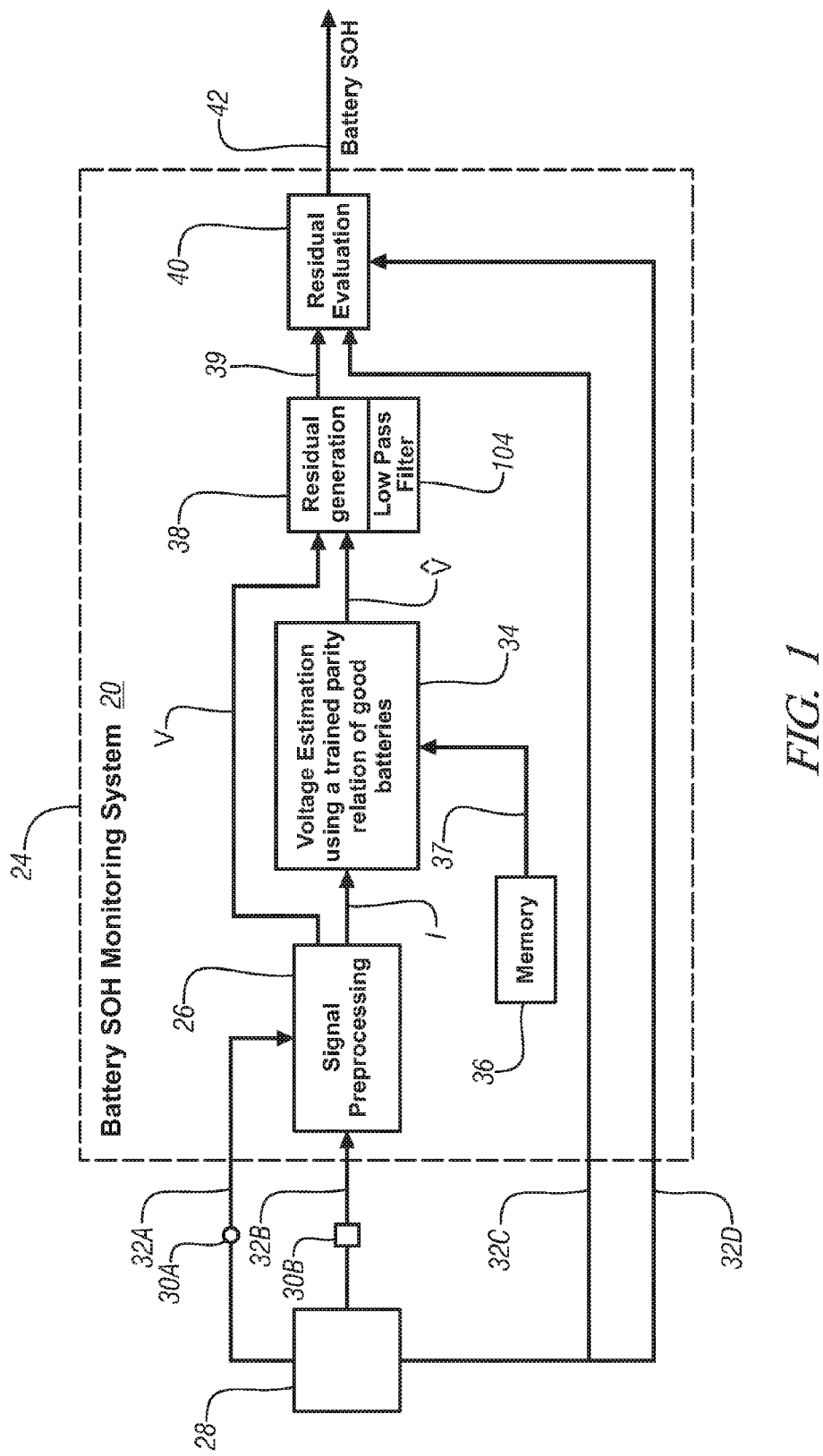
FIG. 1 is a schematic diagram of a parity-relation based battery SOH monitoring and prognosis method in accordance with the present disclosure.

FIG. 1 illustrates a schematic diagram of a battery SOH monitoring system 20 using a parity-relation based battery SOH monitoring and prognosis routine (24). The system 20 includes a plurality of modules that cooperate to process input signals received from a battery on-board a vehicle to determine the battery's SOH. As used herein the term "module" or "modules" is defined as one or more units capable of processing or evaluating signals input into or stored within the battery SOH monitoring system 20. Each module may be a stand-alone unit or a plurality of units comprising hardware or software or a combination thereof.

More particularly, in an embodiment in accordance with the disclosure, the battery SOH monitoring system 20 resides on-board a vehicle and includes a signal preprocessing module 26 adapted to receive a plurality of inputs from a plurality of sensors 30A, 30B that sense parameters of at least one battery 28. A battery voltage sensor 30A monitors battery 28 terminal voltage and provides a battery terminal voltage signal 32A to signal preprocessing module 26. Similarly, a battery current sensor 30B monitors battery 28 current and provides a battery current signal 32B to signal preprocessing module 26. Battery temperature signals 32C, and battery state-of-charge signals 32D are also input to battery SOH monitoring system 20 as further described herein below with respect to a residual evaluation module 40. Signal preprocessing module 26 is adapted to provide an extracted battery voltage signal (V) corresponding to the engine cranking process to residual generation module 38 and an extracted battery current signal (I) corresponding to the engine cranking process to a voltage estimation module 34. The voltage estimator module 34 uses a trained parity-relation adapted to receive calibrated parameters 37 from a memory device 36. The voltage estimator module 34 provides a voltage output ($\hat{V}$) to the residual generation module 38. The residual generation module 38 provides one or more residual value outputs to a residual evaluation module 40. The residual value outputs from the residual generation module 40 may be filtered using an associated low pass filter 104. The residual evaluation module 40 further receives a battery temperature signal 32C provided, for example, from a battery temperature sensor (not shown) or inferred from existing vehicle information such as engine coolant temperature. A battery state-of-charge signal 32D is also provided to the residual evaluation module 40 for example from correlated battery open circuit voltage and battery SOC data. The residual evaluation module 40 is adapted to obtain a battery SOH and provide a battery SOH indicator signal 42.

Figure 2:
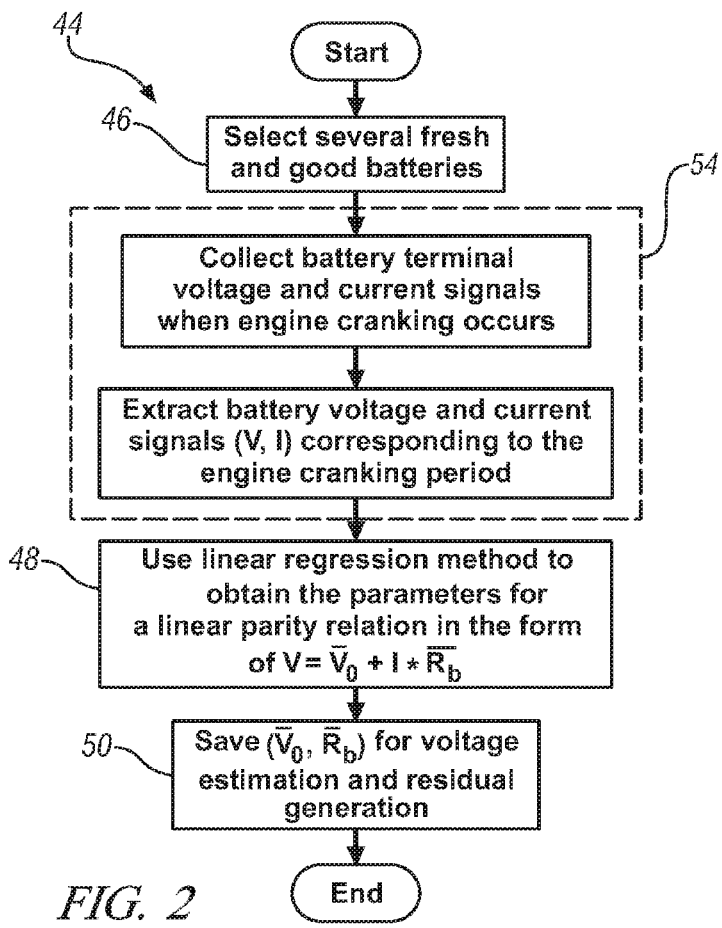
FIG. 2 is a flowchart illustrating the procedure of parity-relation training in accordance with the present disclosure.

FIG. 2 is a flowchart of a routine (44) of off-line training the parity-relation for battery SOH monitoring on-board a vehicle. That is to say, off-line training occurs as part of vehicle development and calibration. Initially, one or more known good batteries capable of delivering a desired power to start a vehicle are selected (46). Next, a preprocessing process (54) is performed to collect battery terminal voltage and current signals during an engine cranking event and to then extract the battery terminal voltage and current signals corresponding to the interval of engine cranking. In this respect, an engine cranking event may include actual engine cranking events or simulated engine cranking events wherein battery discharge events closely mimicking electrical draws upon the battery. The signal preprocessing process (54) is described in more detail in FIG. 3.

Figure 3:
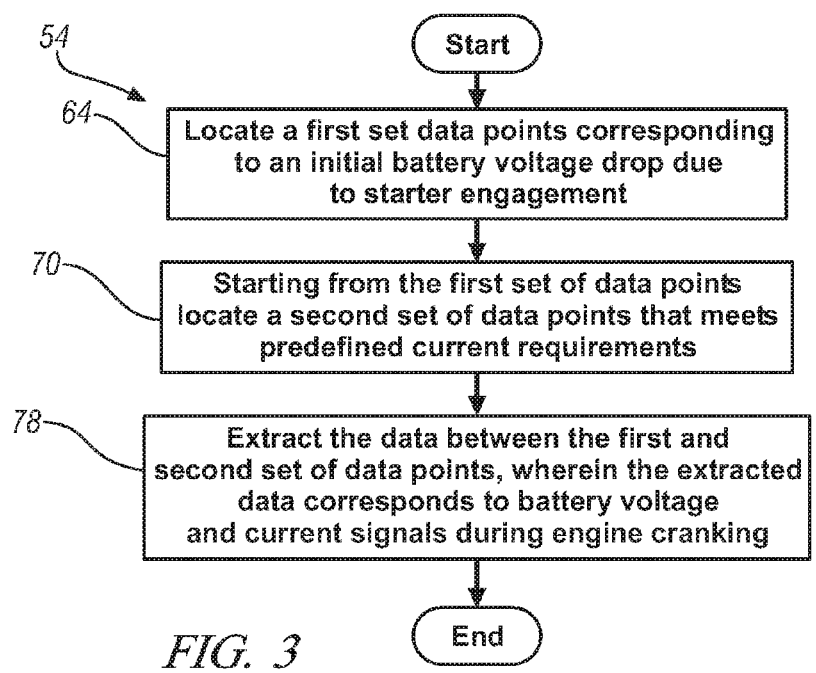
FIG. 3 is a flowchart illustrating the preprocessing procedure to extract the portion of battery signals corresponding to engine cranking in accordance with the present disclosure.

The flowchart in FIG. 3 depicts the preprocessing process (54) used to extract a selected portion of battery signals 56, 58 (shown in FIG. 4) that correspond to engine cranking. With additional reference to FIG. 4, exemplary battery voltage and battery current signals, 56 and 58 respectively, extracted during engine cranking are illustrated.

Figure 4:
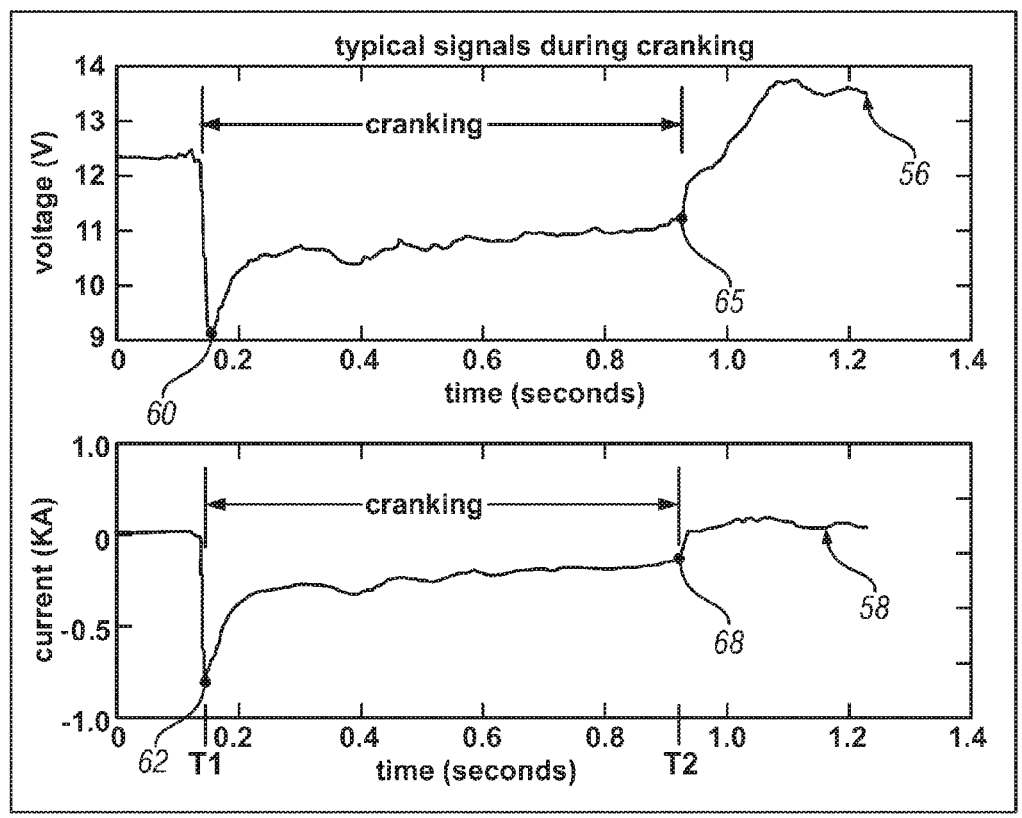
FIG. 4 is a graphical illustration of typical battery current and terminal voltage signals during engine cranking in accordance with the present disclosure.

With continuing reference to FIGS. 2-4, a portion of the battery terminal voltage and current signals corresponding to the period of engine cranking are extracted using the signal preprocessing process (54). More particularly, the extracted portions of the battery terminal voltage 32A and battery current signals 32B characterize battery signals generated during engine cranking occurring during a time interval defined by instant T1 and instant T2. A first set of data points 60, 62 corresponding to an initial voltage drop due to starter engagement at instant T1 is identified (64).

In an embodiment in accordance with the disclosure, a second set of data points 65, 68 corresponding to a first occurrence of a current I exceeding a predefined threshold after instant T1, at instant T2, is identified (70). In one embodiment in accordance with the disclosure, the predefined threshold is −100 A. In another embodiment in accordance with the disclosure, a battery voltage signal threshold can be used to define instant T2. In another embodiment in accordance with the disclosure, only a part of the voltage and current signals in [T1, T2] are considered. In an embodiment in accordance with the disclosure, the signals corresponding to −300 A<I<−100 A may be used. Generally, the voltage and current signals extracted are within a range sufficient to start a vehicle.

Figure 5:
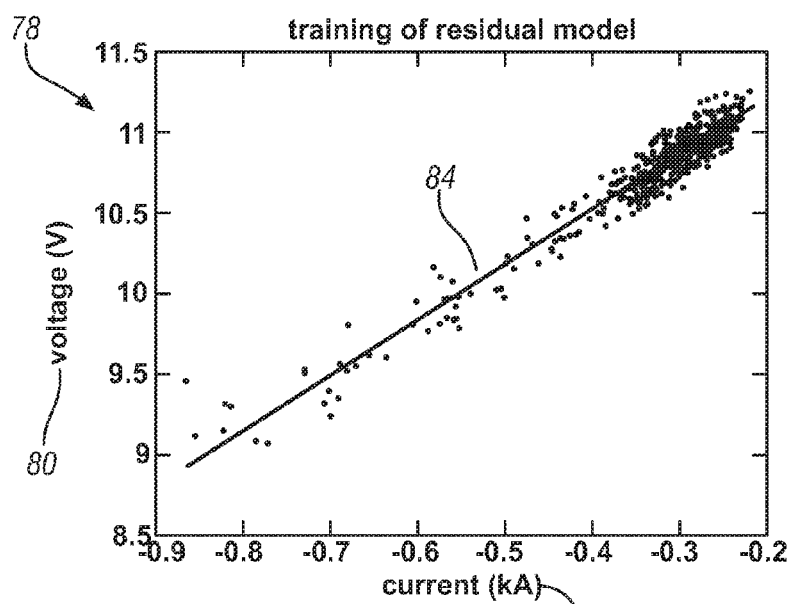
FIG. 5 illustrates the data used to train the parity-relation. The data is shown via a plot of battery terminal voltage versus cranking current in accordance with the present disclosure.

A graphical illustration 78 of extracted cranking data of two known good batteries is shown in FIG. 5, where the battery terminal voltage defines the y-axis 80 and is plotted versus battery current defining the x-axis 82. This cranking data illustrates a linear relationship between the battery terminal voltage and the battery current occurring during an engine cranking event. The cranking data of good batteries is used to train a linear parity-relation, wherein the trained linear parity-relation is depicted as line 84 in FIG. 5. More specifically, parameters $\overline{V}_0$ and $\overline{R}_b$ are determined (48) in FIG. 2 using a least squares method based on the following equation (1):

$$V = \overline{V}_0 + I * \overline{R}_b, \ (I<0 \text{ for discharge}) \qquad (1)$$

wherein $\overline{V}_o$ represents the intercept voltage and $\overline{R}_b$ represents the battery resistance. Equation 1 may be further re-written in the form of Equation (2):

$$\theta = [\overline{V}_0 \overline{R}_b]^T, \ x = [1\,I]^T, \text{ and } y = V = x^T\theta. \qquad (2)$$

Standard parameter estimation methods (recursive or non-recursive) may be used to estimate the unknown parameter vector θ.

In an embodiment, an estimation of the unknown parameter vector θ. can be obtained using a linear least squares fit. Once $\overline{V}_0$ and $\overline{R}_b$ are determined (48) off-line using data collected from known good batteries as shown in FIG. 2, the $\overline{V}_0$ and $\overline{R}_b$ values are saved or stored (50) as calibration parameters within the memory device 36 associated with the voltage estimator module 34. Each of two parameters $\overline{V}_0$ and $\overline{R}_b$ can be saved as a calibration table of battery temperature and SOC.

Figure 6:
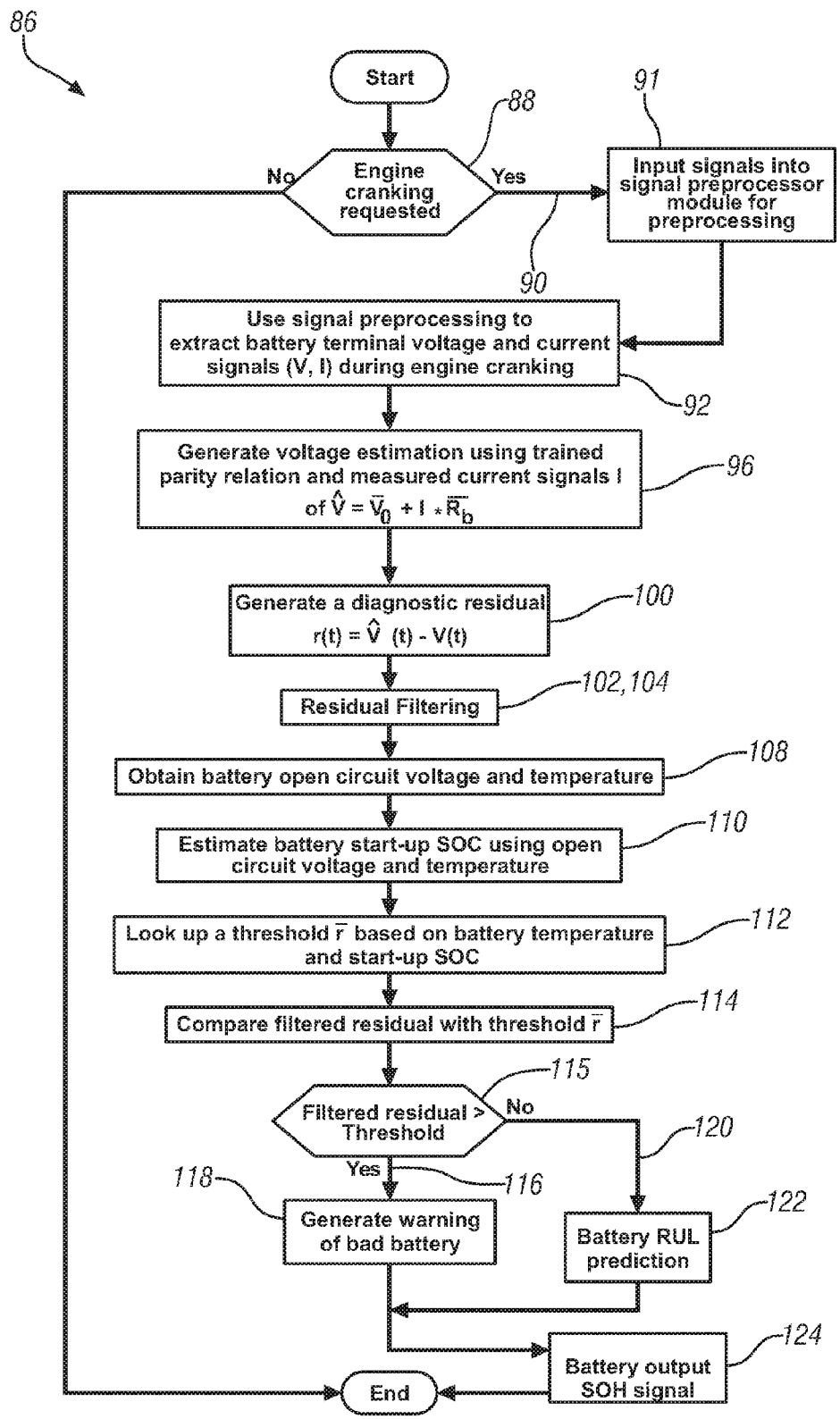
FIG. 6 is a flowchart illustrating the on-board implementation of the SOH evaluation and prognosis method in accordance with the present disclosure.

An on-board implementation of the SOH monitoring and prognosis routine (86) is illustrated in the routine depicted in FIG. 6. First, to evaluate the SOH of any batteries, a decision is made if an engine cranking event has been requested (88). If no engine cranking event or request is made, then the routine ends. If an engine cranking request is made (90), then battery terminal voltage and current signals from a battery on-board a vehicle are inputted (91) into the signal preprocessing module 26 for preprocessing. The battery voltage and battery current signals corresponding to the short period of engine cranking are extracted (92) preferably with the preprocessing process (54) described in more detail in FIG. 3 herein above.

The trained parity-relation parameters $\overline{V}_0$ and $\overline{R}_b$ stored within memory device 36, and the current I extracted during signal preprocessing of the on-board vehicle battery 28 are input into the voltage estimator module 34.

A voltage estimate, $\hat{V}$, of on-board batteries is then determined (96) using the saved trained linear parity-relation parameters of $\overline{V}_0$ and $\overline{R}_b$ as described with reference to FIG. 2 herein above. Voltage estimate $\hat{V}(t)$ at time t is determined as follows in Equation (3):

$$\hat{V}(t) = \overline{V}_0 + I(t) * \overline{R}_b \qquad (3)$$

The voltage estimate, $\hat{V}(t)$, and the actual voltage at time t, V(t), measured and extracted during signal preprocessing (92) of the on-board vehicle battery 28 are input into the residual generation module 38.

A diagnostic residual parameter r(t) defined as a deviation between the voltage estimate $\hat{V}(t)$ and the actual voltage V(t) is then generated (100) by using Equation (4):

$$r(t) = \hat{V}(t) - V(t), \qquad (4)$$

wherein $\hat{V}(t)$ is the voltage estimate, and V(t) is the actual battery terminal voltage of the on-board battery during engine cranking. Thus, the residual r(t) represents a deviation between the actual voltage measurement V(t) and the voltage estimate $\hat{V}(t)$.

In an embodiment, to minimize the effect of noise, the on-board implementation of the SOH evaluation and prognosis routine (86) proceeds to filter a raw residual signal (102) by using a low-pass filter 104.

In an embodiment, an average of the diagnostic residual r(t) can be used for battery SOH monitoring for each cranking data set. Next, as shown in FIG. 6, both the battery temperature and open circuit voltage are obtained (108), from which a battery start-up SOC may be determined (110) by using a calibrated look-up table of battery temperature and battery open circuit voltage. Then, a threshold on the diagnostic residual, $\bar{r}$, may be determined (112) from a look-up table of battery temperature and start-up SOC.

Figure 7:
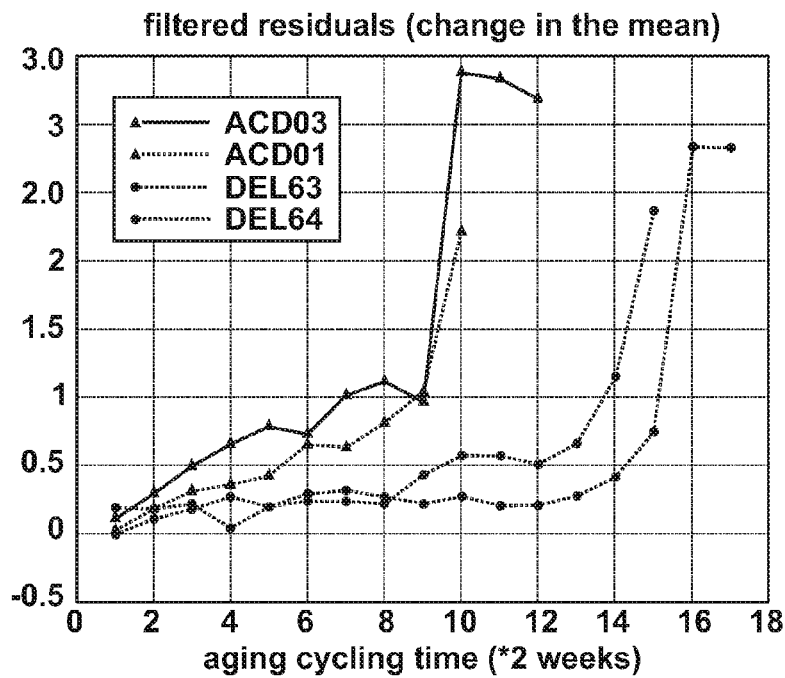
FIG. 7 is a graphical illustration showing a trend of the diagnostic residual with respect to battery aging in accordance with the present disclosure.

FIG. 7 is a graphical illustration depicting the trend of the diagnostic residual with respect to battery aging. Four batteries were aged from fresh to dead through accelerated cycling. The cranking data was periodically collected during the aging process. As shown in FIG. 7, all the residuals increase as a result of batteries aging.

Through some algebraic manipulations, it can be shown that the residual implicitly combines battery SOH information provided by multiple SOH indicators which may include, but are not limited to, battery voltage loss and internal resistance during engine cranking. Hence diagnostic accuracy and robustness may be improved. More specifically, the residual remains around zero for good batteries. As the battery ages, the residual is seen to significantly increases due to increasing battery voltage loss and internal resistance.

Finally, the battery SOH may be determined by comparing the generated residual value to a predefined threshold (114). The comparison determines if the filtered residual value exceeds the threshold of the diagnostic residual (115). If the filtered residual exceeds the threshold of the diagnostic residual (116), a warning message indicating a bad battery may be provided (118). Otherwise, if the filtered residual does not exceed the threshold of the diagnostic residual (120), a battery SOH index is generated (122) by using Equation (5):

$$SOH_{INDEX} = \frac{r - \bar{r}}{r_{fresh} - \bar{r}} * 100\%, \quad (5)$$

wherein $\bar{r}$ is the residual threshold, and $r_{fresh}$ is the nominal residual value for fresh and good batteries. When SOH<0, SOH is set to 0%, and when SOH>1, SOH is set to 100%. The battery SOH characterizes the battery remaining useful life (RUL).

Finally the battery SOH signal is output (124) from the battery SOH monitoring system 20 to notify a user of the battery's SOH.

Figure 8:
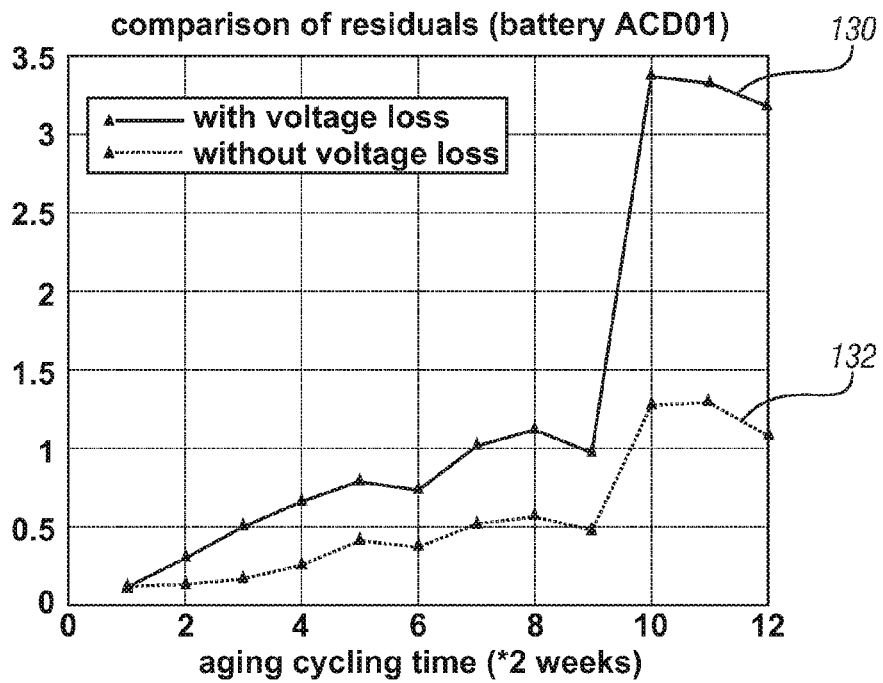
FIG. 8 illustrates advantages of the SOH monitoring system and method of the present invention by comparing a generated diagnostic residual of the instant invention and a residual generated by known resistance-based methods in accordance with the present disclosure.

FIG. 8 is a graphical illustration of one aspect of the present parity-relation based SOH monitoring system 20 routine (86). The solid curve 130 represents the diagnostic residual generated by using the present disclosure. The dotted curve 132 corresponds to the residual generated by using a known resistance-based method. The present disclosure demonstrates improved fault sensitivity and robustness over known methods.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. An on-board battery state-of-health monitoring and prognosis apparatus for a vehicle comprising an engine, comprising:
   a signal preprocessing module for extracting portions of on-board battery terminal voltage and current signals after an initial voltage drop during an on-board engine cranking process;
   a memory storage device for recalling parity-relation parameters between battery voltage and current signals derived during off-line battery discharge events corresponding to at least one off-line battery capable of delivering a desired power to crank the engine, wherein the parity-relation parameters are trained using a linear regression model;
   a voltage estimation module for estimating battery voltage of said an on-board battery based on recalled parity-relation parameters and the extracted portions of the on-board battery current signals extracted during the on-board engine cranking event;
   a diagnostic residual generation module for generating a diagnostic residual defining a deviation between the estimated battery voltage of the on-board battery and the extracted portion of the on-board battery terminal voltage signals; and
   a residual evaluation module for providing a measure of battery state-of-health based on said diagnostic residual.

2. The apparatus of claim 1, wherein the diagnostic residual generation module comprises a low pass filter.

3. An on-board vehicular battery state-of-health monitoring and prognosis method for a vehicle comprising an engine comprising:
   determining off-line parameters of a parity-relation between extracted battery signals using at least one off-line battery capable of delivering a desired power to crank the engine, wherein the parity-relation parameters are trained off-line using a linear regression model;
   storing the off-line determined parity-relation parameters in a memory device associated with a voltage estimation module within a battery state-of-health monitoring system on-board the vehicle;
   inputting on-board battery terminal voltage and current signals from an on-board battery into a signal preprocessor module within said battery state-of-health monitoring system during an on-board engine cranking event;
   extracting after an initial voltage drop during the on-board engine cranking event a portion of the on-board battery terminal voltage and current signals using the signal preprocessor module;
   estimating the battery voltage of the on-board battery using the stored off-line determined parity-relation parameters and the extracted portion of the on-board battery current signals;
   generating a diagnostic residual with a residual generation module, wherein the diagnostic residual represents a deviation between the estimated battery voltage and the corresponding on-board battery terminal voltage signals; and
   evaluating the diagnostic residual in a residual evaluation module to determine a state-of-health metric of the on-board battery.

* * * * *